United States Patent [19]
Hegedus

[11] Patent Number: 6,121,581
[45] Date of Patent: Sep. 19, 2000

[54] SEMICONDUCTOR PROCESSING SYSTEM

[75] Inventor: Andreas G. Hegedus, Burlingame, Calif.

[73] Assignee: Applied Materials, Inc., Santa Clara, Calif.

[21] Appl. No.: 09/350,801

[22] Filed: Jul. 9, 1999

[51] Int. Cl.[7] ...................................................... F27B 5/14
[52] U.S. Cl. .......................... 219/390; 392/416; 118/724; 118/50.1
[58] Field of Search ..................................... 219/390, 405, 219/411; 118/724, 725, 728, 50.1; 392/416, 418; 250/492.2

[56] References Cited

U.S. PATENT DOCUMENTS 3,623,712  11/1971  McNeilly et al. ....................... 118/725
5,155,336  10/1992  Gronet et al. ........................... 219/411
5,755,511   5/1998  Peuse et al. .

FOREIGN PATENT DOCUMENTS 8-213379  8/1996  Japan .

*Primary Examiner*—Teresa Walberg
*Assistant Examiner*—Shawntina Fuqua
*Attorney, Agent, or Firm*—Fish & Richardson

[57] ABSTRACT

A semiconductor processing system includes a semiconductor processing chamber, a heat source assembly and a window. The window is located over an opening into a main body of the chamber. The heat source assembly is evacuable to alter the pressure differential across the window.

10 Claims, 3 Drawing Sheets

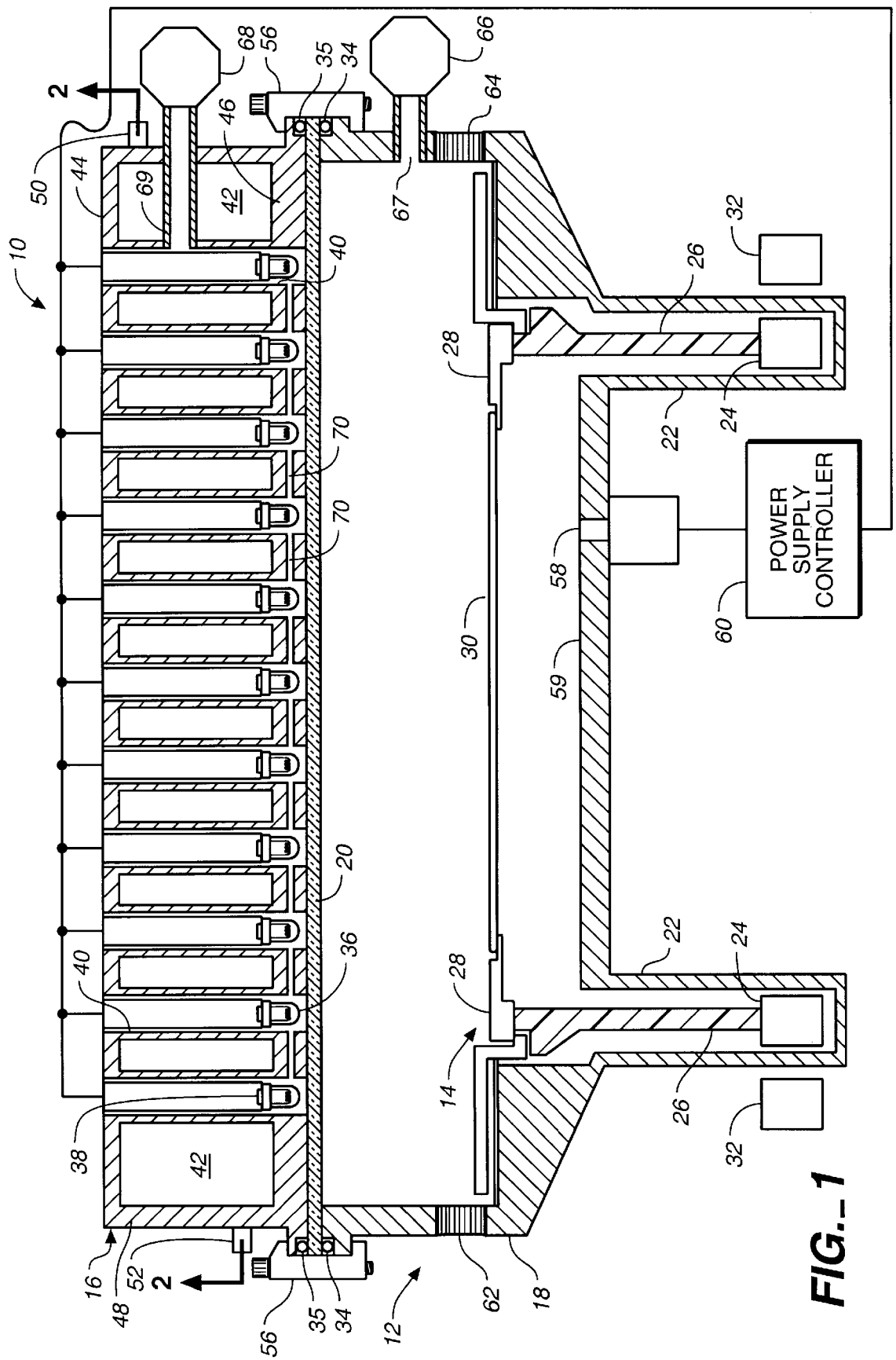
FIG._1

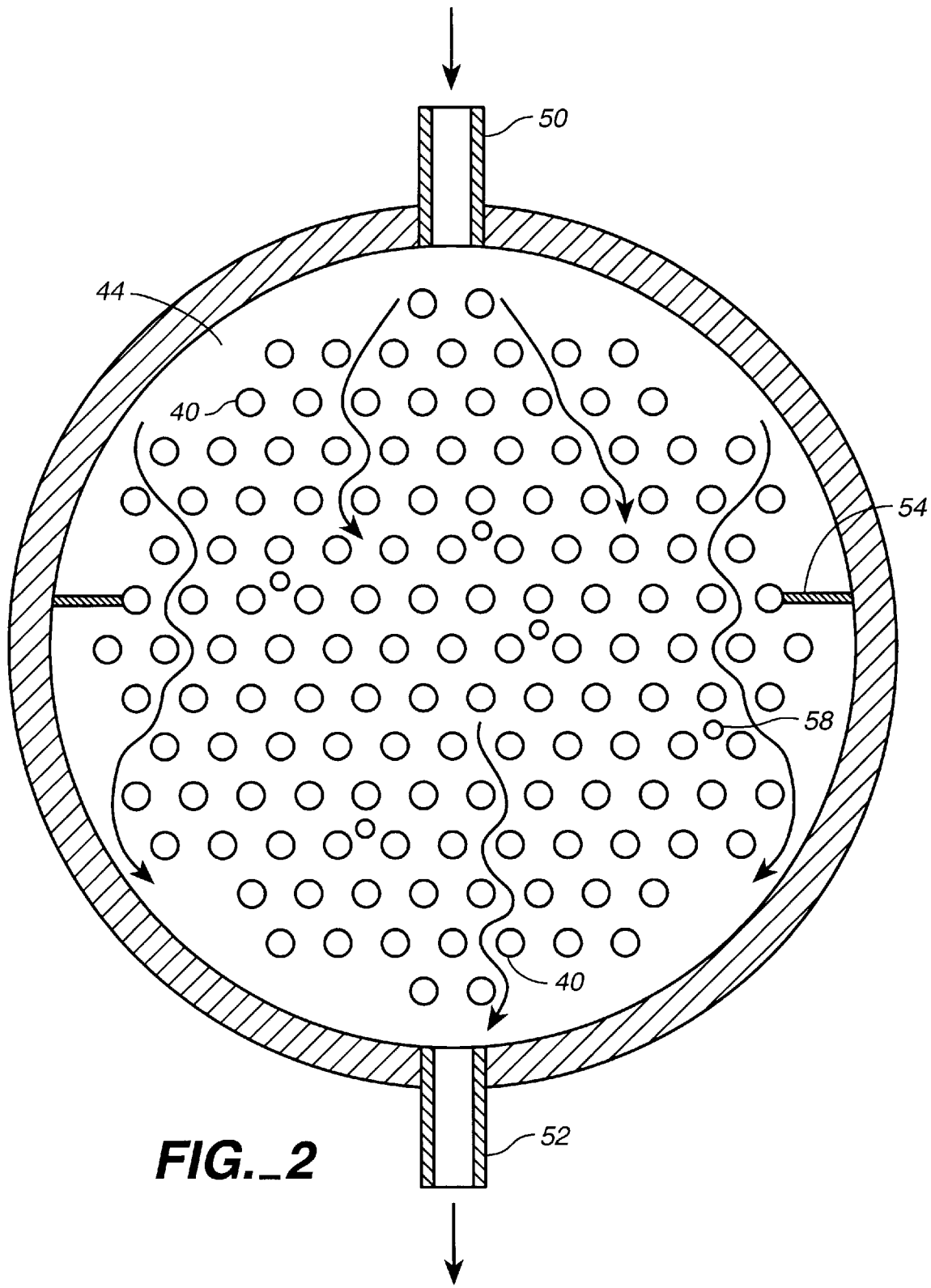
FIG._2

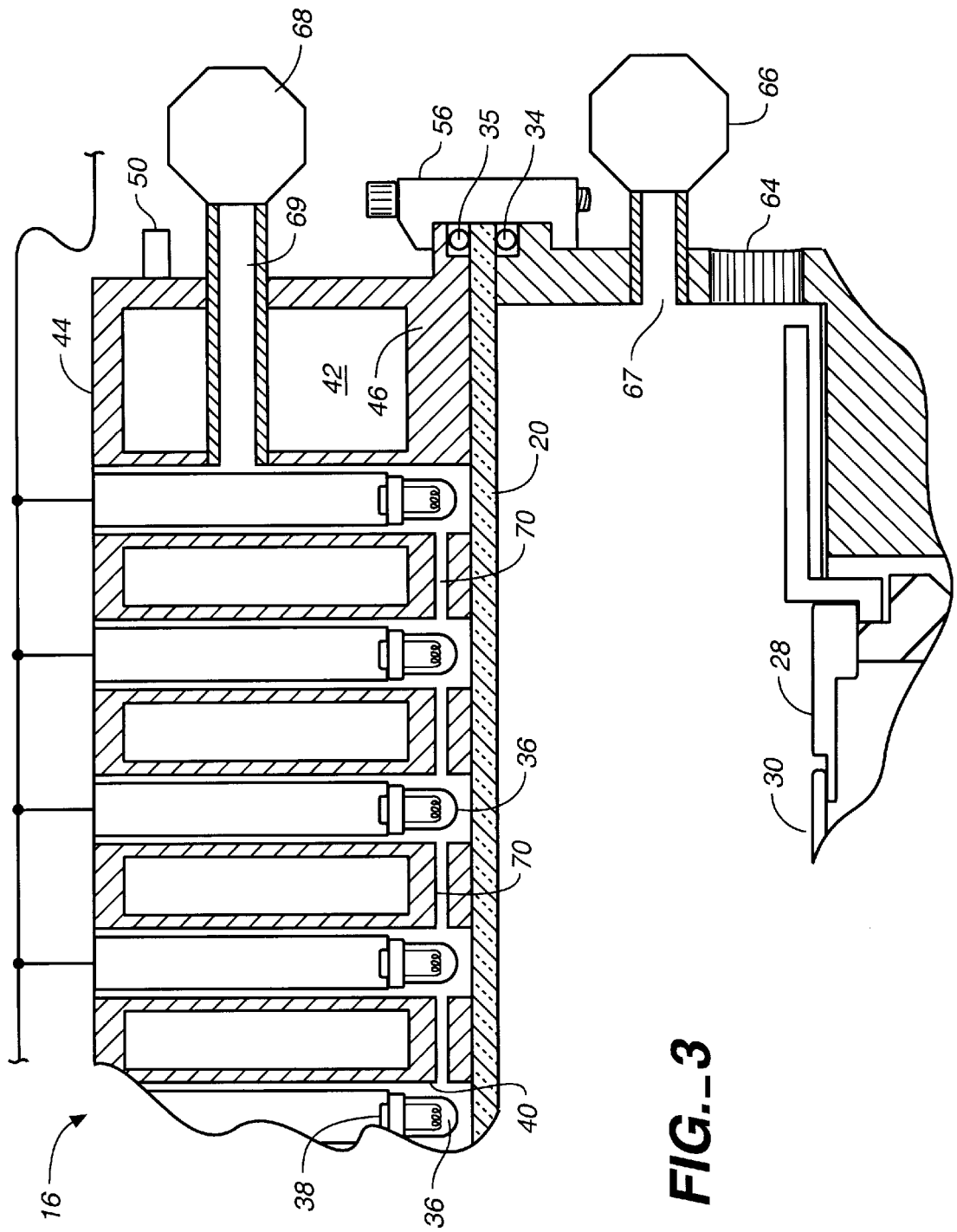
FIG._3

SEMICONDUCTOR PROCESSING SYSTEM

BACKGROUND OF THE INVENTION

This invention relates generally to a semiconductor processing system and, more specifically, to a semiconductor processing system having a processing chamber and a heat source assembly.

Rapid thermal processing (RTP) systems are employed in semiconductor chip fabrication to create, chemically alter or etch surface structures on semiconductor wafers. One such RTP system, as described in U.S. Pat. No. 5,155,336, includes a semiconductor processing chamber and a lamp head or heat source assembly located on the semiconductor processing chamber.

The semiconductor processing chamber may be fitted with an adapter plate for low pressure operation. The adapter plate includes a lower quartz window, an upper quartz window and a strengthening component which is sandwiched between the lower and upper windows. The strengthening component may be made of stainless steel and comprises two spaced plates and a surrounding ring which jointly define an enclosed volume. A plurality of tubes are welded into through holes in the plates to form light passageways.

A number of infrared lamps are located in the lamp head. During processing, infrared radiation from the lamps radiate through the upper window, the light passageways and the lower window onto a wafer in the processing chamber. In this manner, the wafer is heated to a required processing temperature.

During processing, the pressure within the processing chamber may be at a subatmospheric pressure. The reduced pressure within the semiconductor processing chamber results in a negative pressure on the lower surface of the lower window. The pressure within the enclosed volume defined by the plates and the surrounding ring can be reduced to a pressure which is lower than the pressure within the processing chamber in order to prevent collapse of the lower window and the lower plate. To this end, a port extends through the surrounding ring and is connected to a pump to reduce the pressure within the enclosed volume defined by the spaced plates and the ring.

SUMMARY OF THE INVENTION

In general, the invention is directed to a semiconductor processing system. In one aspect, the invention features a process chamber having a window and a support on which a substrate may be positioned during processing. An assembly of radiant energy sources is located on a side of the window opposite from that of the support to direct radiant energy through the window and onto a substrate on the support. The radiant energy assembly is evacuable to alter the pressure differential across the window.

The process chamber may be at atmospheric pressure during processing, and the pressure differential across the window may be increased by evacuating the radiant energy assembly. Alternatively, the process chamber may be at subatmospheric pressure during processing, and the pressure differential across the window may be reduced by evacuating the radiant energy assembly. In one embodiment, the semiconductor processing system includes sensors to determine the temperature of different regions of the substrate and to output a signal representative thereof. A controller is programmed to control the intensity of the radiant energy sources in response to a signal received from the sensors to thereby control the temperature of different regions of the substrate.

In another aspect, the invention is directed to an apparatus for processing a substrate. The apparatus includes a chamber having at least one wall and a window sealed to the at least one wall of the chamber. A heat source assembly including a plurality of radiant energy sources is provided to radiate regions of the substrate within the chamber with a pattern of radiation intensity. The heat source assembly is sealed to the window and means are provided for evacuating the heat source assembly to reduce the pressure therein. The apparatus may further include means for evacuating the chamber.

In yet another aspect, the invention features a system for rapid thermal processing of a substrate. The system includes a process chamber having a window, and an assembly of radiant energy sources and reflectors disposed outside of the process chamber adjacent to the window. The assembly directs radiant energy through the window onto a substrate in the process chamber. A vacuum pump is provided to evacuate the assembly to reduce the pressure therein.

This system may further include a second vacuum pump to evacuate the process chamber. The process chamber window may be a quartz plate which is about four millimeters thick. The reflectors can extend into a cooling chamber through which coolant can be circulated. The interior spaces of the reflectors are in fluid communication with each other.

Among the advantages of the invention are that the process chamber window may be made relatively thin and the need for an adapter plate is eliminated.

Other features and advantages of the invention will be apparent from the following detailed description, the accompanying drawings and the claims.

BRIEF DESCRIPTION OF THE DRAWINGS

The invention is further described by way of examples with reference to the accompanying drawings wherein:

FIG. 1 is schematic side view of a semiconductor processing system according to the invention;

FIG. 2 is a sectional view of the semiconductor processing system taken along line 2—2 of FIG. 1; and FIG. 3 is an enlarged view of a portion of the semiconductor processing system of FIG. 1.

DETAILED DESCRIPTION OF THE INVENTION

A semiconductor processing system including an evacuable lamp head or heat source assembly and a semiconductor processing chamber are described. In the following description, specific details are set forth in order to provide a thorough understanding of the invention. It will be appreciated, however, by one skilled in the art that the invention may be practiced without these specific details. In other instances, well-known elements have not been shown in order to avoid unnecessarily obscuring the invention.

As shown in FIGS. 1 and 2, a semiconductor processing system 10 includes a semiconductor processing chamber 12, a wafer handling or support apparatus 14 located within the semiconductor processing chamber, and a lamp head or heat source assembly 16 located on the semiconductor processing chamber.

The semiconductor processing chamber 12 includes a main body 18, and a window 20 resting on the main body. The window is made of a material that is transparent to infrared light. For example, the window may be made of clear fused silica quartz.

The main body 18 is made of stainless steel with a quartz inner liner (not shown). A circular channel 22 forms part of a base of the main body.

The wafer handling apparatus 14 includes a magnetic rotor 24 within the channel 22, a quartz tubular support 26 resting on or otherwise coupled to the magnetic rotor, and a silicon carbide coated graphite edge ring 28 resting on the tubular support. During processing, a wafer 30 rests on the edge ring.

A magnetic stator 32 is located externally of the channel 22 and is used to magnetically induce rotation of the magnetic rotor through the main body 18. Rotation of the magnetic rotor causes rotation of the susceptor.

The window 20 rests on an upper edge of the main body 18. An o-ring 34 is located between the window and the main body to provide an air-tight seal at the interface.

The lamp head assembly 16 overlies the window 20. An o-ring 35 is located between the window and the lamp head to provide an air-tight seal at that interface. The lamp head includes a plurality lamps 36 that are supported by electrical sockets 38. In one embodiment, the lamps 36 are infrared radiation emitting light bulbs. The lamps are located inside of reflectors 40. The reflectors are made of any suitable light reflecting material such a stainless steel. The open end of the reflectors, as shown, are located adjacent window 20.

A cooling chamber 42 is defined by upper and lower chamber walls 44 and 46, respectively, and a cylindrical wall 48. A coolant, such as water, is introduced into the chamber via an inlet 50 and is removed at an outlet 52. Referring particularly to FIG. 2, the fluid travels in the space between the reflectors and serves to cool the reflectors. Baffles 54 may be included to ensure proper flow of the coolant through the chamber.

Clamps 56 secure the window 20, the lamp head 16 and the process chamber 12 to one another.

Sensors, such as one or more pyrometers 58, are located in a reflective lower wall 59 of the main body 18 and are positioned to detect a temperature at a lower surface of the wafer 30. Each pyrometer is connected to a power supply controller 60 which controls the power supplied to each of the infrared lamps 36 in response to a measured temperature. Such a control system is described in U.S. Pat. No. 5,755, 511, assigned to the assignee of the present invention, the entire disclosure of which is incorporated herein by reference.

The main body of the processing chamber 12 includes a processing gas inlet port 62 and a gas outlet port 64. In use, the pressure within the processing chamber is reduced to a subatmospheric pressure prior to introducing a process gas through the inlet port 62. The process chamber is evacuated by pumping through a conduit or port 66 by means of a vacuum pump 67. The pressure is typically reduced to between about 1 torr and 160 torr. Certain processes may be run at atmospheric pressure and the process chamber will not need to be evacuated for these processes.

Another vacuum pump, vacuum pump 68, is provided to reduce the pressure within the lamp head assembly 16. The pressure within the lamp head assembly is reduced by pumping through a conduit or port 69 which extends through the cooling chamber 42 and is in fluid communication with an interior space of one of the reflectors 40. As shown in FIG. 3, the interior space of this particular reflector is, in turn, in fluid communication with the interiors of the other reflectors via small passageways 70, which extend through the walls of the reflectors.

Alternatively, the passageways 70 may be eliminated. The interior spaces of the reflectors are then in fluid communication with each other by means of the spaces and voids that are present in the lamp head assembly.

As noted, the window 20 is typically made of quartz. Quartz has a high compressive strength, but a relatively low tensile strength. Therefore, if the window is not thick enough, a significant pressure differential across it can cause it to break or fracture.

By providing an evacuable lamp head assembly, the pressure differential across the window 20, which would be present during a subatmospheric process, can be considerably reduced or eliminated. As such, the window can be made very thin. For example, a 12 inch diameter window may be only four millimeters thick. As such, problems associated with the use of thicker quartz windows, such as poor light distribution and loss of spatial resolution, are eliminated. Also, the use of the evacuable lamp head eliminates the need for the above-discussed adapter plate. Thus, the semiconductor processing system is less complex and less expensive to construct. The use of an adapter plate also reduces the total amount of radiant energy delivered to a substrate in the process chamber which limits the temperature ramp rate, a problem which this invention also eliminates.

By way of example, the pressure within the lamp head may be reduced to about 10 torr. At this reduced pressure, virtually any subatmospheric rapid thermal process may be run in the process chamber without damaging or breaking the window 20. For processes which are run at atmospheric pressure or between atmospheric pressure and 10 torr, the higher pressure within the process chamber actually provides additional support for the window. The window is adequately supported such that if the pressure within the process chamber is greater than that in the lamp head assembly, the window will not fracture, as its fracture stress will not be exceeded.

The pressure differential across the window should never be more than about 100 torr; otherwise, the window is likely to break.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed is:

1. A semiconductor processing system, comprising:
   a process chamber having a window and a support on which a substrate may be positioned during processing;
   an assembly of radiant energy sources located on a side of the window opposite from that of the support to direct radiant energy through the window and onto a substrate on the support; and
   wherein the radiant energy assembly is evacuable to at least one of increase the pressure differential across the window when the process chamber is at atmospheric pressure or reduce the pressure differential across the window when the process chamber is at subatmospheric pressure.

2. The system of claim 1 further including:
   sensors to determine the temperature of different regions of the substrate and to output a signal representative thereof; and
   a controller programmed to control the intensity of the radiant energy sources in response to a signal received from the sensors to thereby control the temperature of different regions of the substrate.

3. An apparatus for processing a substrate, comprising:

a chamber having at least one wall;

a window sealed to the at least one wall of said chamber;

a heat source assembly including a plurality of radiant energy sources serving to radiate regions of a substrate within said chamber with a pattern of radiation intensity, said heat source assembly sealed to said window; and means for evacuating said heat source assembly to increase the pressure differential across the window when the chamber is at atmospheric pressure or reduce the pressure differential across the window when the chamber is at subatmospheric pressure.

4. The apparatus of claim 3 further including means for evacuating said chamber.

5. A system for the rapid thermal processing of a substrate, comprising:

a process chamber having a window;

an assembly of radiant energy sources and reflectors disposed outside of said process chamber adjacent to the window to direct radiant energy through the window onto a substrate in said process chamber; and a vacuum pump to evacuate said assembly to at least one of increase the pressure differential across the window when the process chamber is at atmospheric pressure or reduce the pressure differential across the window when the process chamber is at subatmospheric pressure.

6. The system of claim 5 further including a second vacuum pump to evacuate said process chamber.

7. The system of claim 5 wherein said window is a quartz plate.

8. The system of claim 5 where said window is about four milliliters thick.

9. The apparatus of claim 5 wherein said reflectors extend into a cooling chamber through which a coolant can be circulated.

10. The apparatus of claim 5 wherein the interior spaces of the reflectors are in fluid communication with each other.

* * * * *